RE 25342

Feb. 3, 1959 J. C. LOGUE 2,872,594

LARGE SIGNAL TRANSISTOR CIRCUITS HAVING SHORT "FALL" TIME

Filed Dec. 31, 1953

*INVENTOR.*
JOSEPH C. LOGUE

*BY* P. E. Henninger

ATTORNEY

1

2,872,594

LARGE SIGNAL TRANSISTOR CIRCUITS HAVING SHORT "FALL" TIME

Joseph C. Logue, Poughkeepsie, N. Y., assignor to International Business Machines Corporation, New York, N. Y., a corporation of New York Application December 31, 1953, Serial No. 401,569

1 Claim. (Cl. 307—88.5)

This invention relates to transistor circuits adapted for operation with signal pulses of large magnitude, such as bistable circuits.

When transistors are used in circuits employing large signal pulses, the transistors are in many cases operated in one of two stable output states which are characterized by widely separated current and potential conditions. The output states are commonly described as the "on" and "off" states, the terms respectively defining high current and low current states. The transistors are usually required to shift back and forth from one state to the other quickly in response to a relatively small input signal.

A transistor may be described as a body of semi-conductive material having an ohmic contact commonly referred to as a base electrode and two asymmetric contacts commonly referred to as emitter and collector electrodes. The semi-conductive material is classified as either n-type or p-type, depending upon whether the majority current carriers in it are electrons or "holes." The emitter electrode supplies to the semi-conductive body minority current carriers. By minority current carriers, it is meant that if the semi-conductive body is n-type, so that the normal current carriers in it are electrons, then the emitter supplies "holes." On the other hand, if the semi-conductive body is p-type, then the emitter supplies electrons. Some of the minority carriers so supplied move to the collector electrode. The arrival of such carriers at the collector electrode is accompanied by a release of majority carriers from the collector, flowing toward the base. Under certain conditions of transistor operation, specifically high collector current and low collector voltage, the collector is unable to attract all the carriers supplied by the emitter, so that excess minority carriers are stored in the body, and a further increment of emitter current does not produce a corresponding increment of collector current. The transistor is then said to be saturated.

A given transistor can operate over a wide range of values of collector current for each value of collector potential, depending upon the emitter current and the load impedance connected in its output (usually its collector) circuit. For a fixed linear load impedance, however, there is only one value of collector current for each value of collector potential. The locus of these values of collector current on the collector current-potential plane is commonly termed the load line. For a linear impedance, the load line is straight, and intersects the region of saturation. The maximum value of collector current, for a fixed linear impedance occurs when the transistor is saturated.

In large signal circuits of the prior art, it has been customary to design the circuits to get maximum current during the "on" condition of the transistor, so that the "on" condition is a condition of saturation. In such a situation, when the transistor is shifted to its "off" condition in response to an input signal, the collector current does not immediately drop to its normal "off" value, but decreases slowly until the accumulation of minority carriers which characterizes the saturation condition has been cleared away. The time required for these excess carriers to be cleared away is commonly referred to as the "fall" time of the transistor. A protracted fall time is undesirable, since it represents a period in which the transistor is less sensitive than normal to incoming signals.

2

There is shown and described in the copending U. S. patent application of Edward L. Peterson, Jr., Serial No. 401,567, filed December 31, 1953, entitled "Electric Circuits Including Transistors," a transistor circuit including a composite load impedance such that the transistor has different effective impedance loads in different operating ranges. It has now been discovered that principles similar to those described in the Peterson application may be applied to the present problem to provide a transistor circuit which does not operate under saturation conditions and which consequently has a short "fall" time.

An object of the present invention is to provide a transistor circuit having a short "fall" time.

Another object is to provide a large signal transistor circuit including means for preventing saturation of the transistor under "on" conditions.

Another object is to provide a transistor circuit having means for preventing saturation of the transistor.

Another object is to provide a transistor circuit having a low output impedance when the transistor is in the "on" condition. A further object is to provide a transistor circuit having an output voltage in the "on" condition which is relatively independent of the transistor characteristics.

The foregoing and other objects of the invention are attained in the circuit described herein by connecting an asymmetric impedance unit and a battery in series in a branch circuit which parallels the conventional load resistor and its associated battery. The potential of the battery in the branch circuit containing the asymmetric impedance unit is made substantially smaller than the potential of the battery in series with the load resistance.

A transistor circuit having a load so designed, i. e., a load resistor in series with a battery and in parallel with a branch comprising an asymmetric impedance unit and another battery, may have, if the impedances and batteries are properly selected, a load line which does not intersect the region of saturation.

Other objects and advantages of the invention will become apparent from a consideration of the following specification, taken together with the accompanying drawing.

Figure 1:
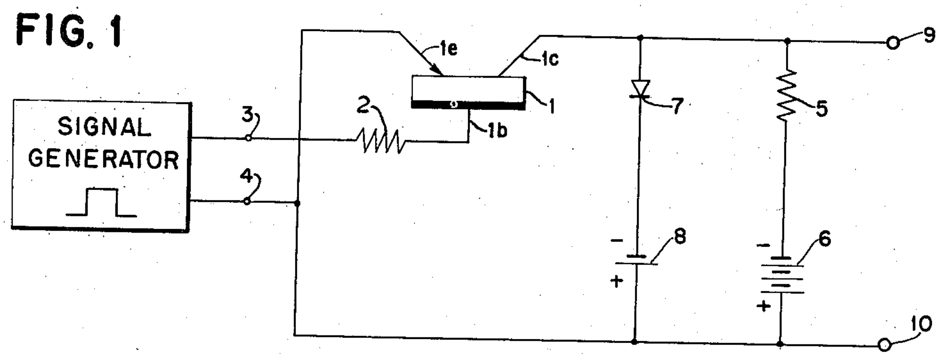
Fig. 1 is a wiring diagram of one form of transistor circuit embodying my invention.

Referring to Fig. 1, there is shown a transistor 1 having a base electrode 1b, a collector electrode 1c and an emitter electrode 1e. The emitter electrode 1e is connected to ground. Input terminals 3 and 4 are connected respectively to the base 1b through a resistor 2 and to ground. Connected between the collector electrode 1c and ground are two parallel branch circuits. One of these branch circuits includes a load resistor 5 and a battery 6 in series. The other branch circuit includes an asymmetric impedance unit 7 and a battery 8 in series. Output terminals 9 and 10 are respectively connected to the collector electrode 1c and to ground.

The battery 8 has a smaller potential than the battery 6. The resistor 5 is chosen so that the potential drop across it when the transistor is in its "on" condition is greater than the difference between the potentials of the batteries 6 and 8. With the asymmetric unit 7 poled as shown in the drawing, the potential difference across the asymmetric unit in the "on" condition is in a direction to send a current through it in its low impedance direction.

When the transistor is "off," the potential drop across resistor 5 is smaller than the difference between the potentials of the batteries 6 and 8, the potential difference across the asymmetric unit 7 is of the opposite polarity, and the flow of current through it is substantially prevented.

Figure 2:
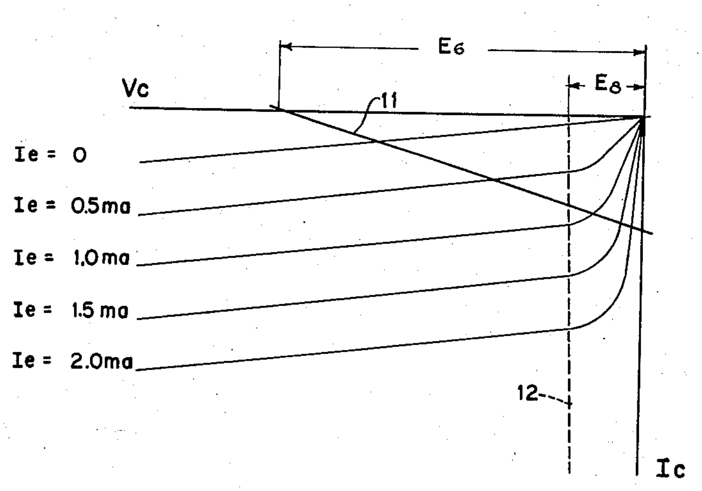
Fig. 2 is a graphical illustration of a family of collector current-potential characteristics for the circuit of Fig. 1.

Fig. 2 illustrates a family of collector current-potential characteristics for the transistor 1. Each curve in Fig. 2 is drawn for a fixed value of emitter current, exemplary values of which are indicated by legend in the drawing. There is superimposed on this family of curves a load line 11, representing the locus of all operating points of the transistor 1 when provided with a collector-base load circuit including only resistor 5 and battery 6. The slope of load line 11 is determined by the impedance of resistor 5. Its location is determined by the potential $E_6$ of battery 6, which sets the point where the load line crosses the horizontal axis (zero collector current, $I_c$).

Also superimposed on the family of curves in Fig. 2 is a load line 12, representing the locus of all operating points of transistor 1 when provided with a collector-base load circuit including only asymmetric unit 7 and battery 8. The slope of load line 12 is determined by the forward impedance of unit 7, and its location by the potential $E_8$ of battery 8. It may be seen that current is conducted through asymmetric unit 7 only when the collector potential, $V_c$, becomes more positive than the negative terminal of battery 8.

When the collector potential $V_c$ is more negative than the negative terminal of battery 8, a current flows through asymmetric impedance unit 7 in its reverse or high impedance direction. This current is very small, and may be neglected without substantial error. It is therefore not graphically represented in Fig. 2.

The region of saturation, as illustrated graphically in Fig. 2, is that region to the right of the load line 12 where the constant emitter current curves depart from linearity and curve upwardly toward the origin.

The composite load line in Fig. 2 for the circuit of Fig. 1 follows the line 11 from its intersection with the horizontal axis to its intersection with line 12, and then follows line 12 downwardly. For any value of $V_c$ smaller than $E_8$, the current value on load line 11 is so small compared to the current value on load line 12 that the former may be neglected.

It may therefore be seen that all practical operating points for the transistor 1 in the circuit of Fig. 1 lie outside its region of saturation. Consequently the "fall" time of the transistor, when the input signal is removed, is reduced to a very short period. By connecting a load resistor, an asymmetric unit, and two batteries as shown in Fig. 1, the same results may be secured with any transistor. Certain conditions must be observed, however, with regard to the selection of battery potentials, as follows: (1) the potential of battery 6 must be greater than the potential of battery 8; (2) the potential drop across resistor 5 must vary through a range extending on both sides of the difference between the potentials of batteries 6 and 8; and (3) the forward impedance of asymmetric impedance unit 7 must be so related to the potential of battery $E_8$ that the load line 12 is outside the saturation region. There are no specific limits of impedance or potential required to meet the last condition, but it is desirable that the forward impedance of asymmetric unit 7 be as small as possible, so that load line 12 will be as nearly vertical as possible.

Figure 3:
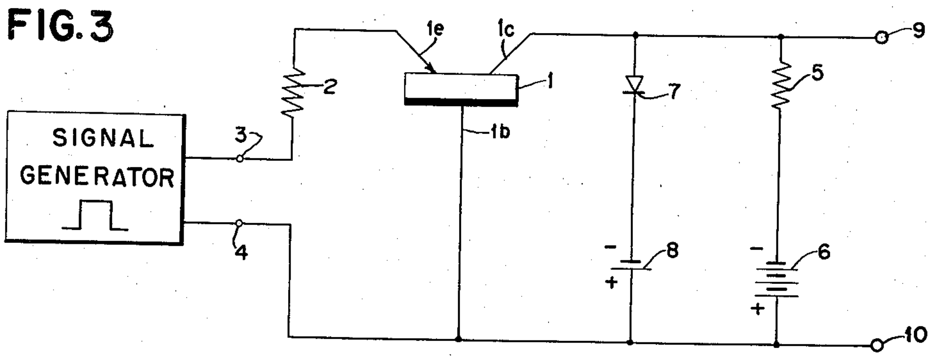
Fig. 3 is a wiring diagram of a modified form of circuit embodying the invention.

The invention has been described above as applied to a transistor having a base input. It is equally applicable to transistors having emitter inputs. Fig. 3 illustrates such a circuit. Since each of the circuit elements in Fig. 3 is the substantial equivalent of the corresponding element in Fig. 1, the same reference numerals have been used. In illustrating graphically the characteristics of the circuit of Fig. 3, each curve in the collector potential current plane will be drawn for a constant value of base current.

The operation of the circuit of Fig. 3 is considered to be obvious from the foregoing description of the Fig. 1 circuit, and it will not be further described.

This invention is of value in any circuit utilizing signals which are on for appreciable lengths of time (i. e., 3 or more microseconds). Where signals pulses of 1 microsecond or less are used, few minority carriers are stored because of the short times involved, and no "fall" time problem arises.

The circuits shown and described are indicated as for a point contact transistor of n-type semi-conductive material. It will readily be recognized that the invention is equally applicable to point contact transistors of p-type material and to junction transistors.

While I have shown and described certain preferred embodiments of my invention, other modifications thereof will readily occur to those skilled in the art and I therefore intend my invention to be limited only by the appended claim.

I claim:

An electric circuit for large signal operation, comprising a transistor having a semi-conductive body, a first base electrode in ohmically conductive relation with said body, and second and third electrodes in conductive relation with said body at localities spaced from each other and from said base electrode, said body providing asymmetrically conductive current paths between said second and third electrodes and said base electrode; a signal input circuit connected between said base electrode and said second electrode, said input circuit including a junction and a source of signal energy shiftable between a signal condition in which it supplies electrical energy at a substantial potential and of a polarity to produce a current flow through the asymmetrically conductive current path between said second electrode and said base electrode in the low impedance direction thereof and a no-signal condition in which it supplies substantially no energy of said polarity; load circuit means comprising two parallel branch circuits connected between said third electrode and said junction; one of said branch circuits comprising a load resistor, a first source of unidirectional electrical energy, and means connecting said resistor and said source in series between said third electrode and said junction, said first source having a polarity to bias the asymmetrically conductive path between said third electrode and said base electrode for current flow in its high impedance direction; the current from said signal source in its signal condition being effective to increase the current flow through said last-mentioned path from said first source, said increased current flow being effective to increase the potential drop across said load resistor and thereby to reduce the potential of said third electrode with respect to said junction, said semi-conductive body being subject to a saturation condition when the signal source is in its signal condition and the potential of said third electrode with respect to said junction falls below a characteristic value; the other of said two parallel branch circuits consisting of a second source of unidirectional electrical energy having a potential smaller than said first source but greater than said characteristic value, means directly connecting said junction to the terminal of the second source having the same polarity as the terminal of the first source connected to said junction, an asymmetrically conductive diode connected directly between said third electrode and the other terminal of said second source, said diode having substantially zero impedance in its low impedance direction and poled so that current from said second source flows therethrough in said low impedance direction, said diode and said second source cooperating to prevent excursions of the potential of said third electrode substantially below that of said second source, and thereby to prevent establishment of said saturation condition in said semi-conductive body and means for taking an output between said third electrode and said junction.

References Cited in the file of this patent

UNITED STATES PATENTS

| | | |
|---|---|---|
| 2,594,336 | Mohr | Apr. 29, 1952 |
| 2,644,897 | Lo | July 7, 1953 |
| 2,665,845 | Trent | Jan. 12, 1954 |
| 2,670,445 | Felker | Feb. 23, 1954 |
| 2,718,613 | Harris | Sept. 20, 1955 |